United States Patent
Stefani

(10) Patent No.: US 10,082,601 B2
(45) Date of Patent: Sep. 25, 2018

(54) SYSTEM AND METHOD FOR GEOMECHANICAL AND ROCK PHYSICS ELASTOSTATIC MODELING

(71) Applicant: Joseph Paul Stefani, San Francisco, CA (US)

(72) Inventor: Joseph Paul Stefani, San Francisco, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 901 days.

(21) Appl. No.: 14/560,913

(22) Filed: Dec. 4, 2014

(65) Prior Publication Data

US 2016/0161634 A1     Jun. 9, 2016

(51) Int. Cl.
*G01V 99/00*     (2009.01)
*G06F 17/50*     (2006.01)

(52) U.S. Cl.
CPC ........ *G01V 99/005* (2013.01); *G06F 17/5018* (2013.01)

(58) Field of Classification Search
None
See application file for complete search history.

(56) References Cited

U.S. PATENT DOCUMENTS

| | | | |
|---|---|---|---|
| 7,707,018 B2 | 4/2010 | Shaw et al. | |
| 8,098,543 B2 | 1/2012 | Bachrach et al. | |
| 2008/0071505 A1* | 3/2008 | Huang | G01V 11/00 703/2 |
| 2008/0288172 A1* | 11/2008 | Stone | G01V 11/00 702/13 |
| 2008/0319675 A1 | 12/2008 | Sayers | |
| 2013/0218538 A1 | 2/2013 | Fuecker et al. | |
| 2013/0346042 A1 | 12/2013 | Shen et al. | |
| 2014/0015841 A1 | 1/2014 | Killough | |

OTHER PUBLICATIONS

G.M. Cocchi et al., "Convergence in Elastic-Static Analysis of Three-Dimensional Continua Using the Finite Difference Method with Arbitrary Grids", Computers & Structures, vol. 36, No. 3, pp. 389-400, Jan. 1, 1990.
G.M. Cocchi, "The Finite Difference-Method with Arbitrary Grids in the Elastic-Static Analysis of Three-Dimensional Continua", Computers & Structures, pp. 187-208, Jan. 1, 2000.
V. Pavlin, et.al., "Finite Difference Energy Techniques for Arbitrary Meshes Applied to Linear Plate Problems", International Journal for Numerical Methods in Engineering, vol. 14, No. 5, pp. 647-664, Jan. 1, 1979.
Erik H. Saenger, et al., "Effective Elastic Properties of Fractured Rocks: Dynamic vs. Static Considerations", International Journal of Fracture, vol. 139, No. 3-4, p. 569-576, Jun. 1, 2006.

(Continued)

*Primary Examiner* — Syed Roni
(74) *Attorney, Agent, or Firm* — Albert K. Shung; Marie L. Clapp

(57) ABSTRACT

A method for geomechanical and rock physics modeling of a geologic volume of interest may include solving for the elastostatic boundary value problems using a finite-difference method which applies the Virial Theorem.

3 Claims, 5 Drawing Sheets

(56) References Cited

OTHER PUBLICATIONS

PCT Notification of Transmittal of the International Search Report and the Written Opinion of the International Searching Authority, or the Declaration, dated Jul. 23, 2014, 12 pages.

Antonio Bobet, "Numerical Methods in Geomechanics" The Arabian Journal of Science and Engineering, vol. 35, No. 1B, pp. 27-48, Apr. 2010.

Ziad Halibi, "Finite Difference-Boundary element Methods in Infinite and Semi-infinite Media in Geomechanics", vol. 1, pp. 1, 1-504, Waterloo, Ontario, Canada 2013.

E. Siebrits, et.al., "Geotechnical Application of a Two-Dimensional Eastodynamic Displacement Discontinuity Method", Rock Mechanics in the 1990's, vol. 30, No. 7, pp. 1387-1393, 1993.

Joseph Stefani, "The earth is cleverer than you are-Learnings in earth and seismic modeling", Association Roundtable-Domestic Program Abstracts, AAPG Bulletin, V. 98, No. 1, p. 166, Jan. 2014.

PCT International Preliminary Report on Patentability, International Application No. PCT/US2015/021688 dated Jun. 15, 2017, pp. 1-9.

\* cited by examiner

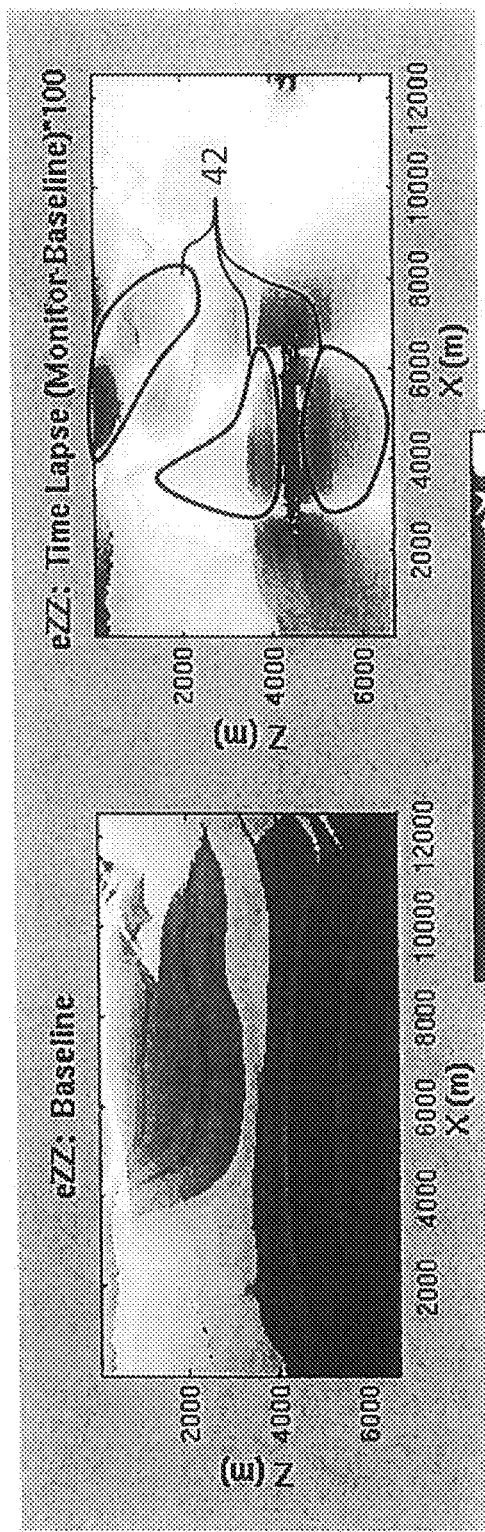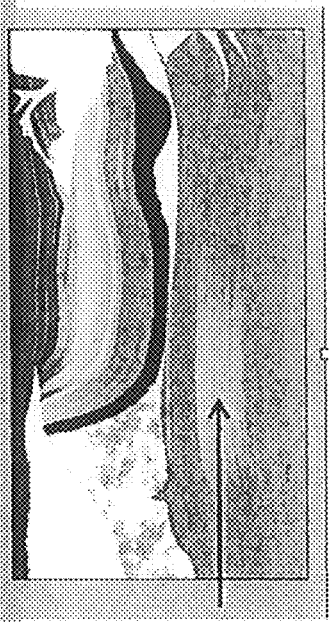
FIG. 4A
FIG. 4B
FIG. 4C

SYSTEM AND METHOD FOR GEOMECHANICAL AND ROCK PHYSICS ELASTOSTATIC MODELING

FIELD OF THE INVENTION

The present invention relates generally to methods and systems for earth modeling and, in particular, to systems and methods for geomechanical and rock physics elastostatic modeling.

BACKGROUND OF THE INVENTION

Geomechanical modeling seeks to accurately calculate the displacements, stresses and strains within an earth volume of interest, given certain elastic boundary conditions and a distribution of body forces. Similarly, the newer and closely related discipline of digital rock physics seeks to accurately calculate the elastic stiffness of a 3D gridded representation of a rock sample. In both applications it is necessary to calculate the solution of a well-defined elastostatic boundary value problem in a heterogeneous elastic model, requiring considerable computational effort.

Current solution methods rely predominantly on the Finite Element Method (FEM) to solve this equation for the output of interest. FEM is an accurate solution method, but it suffers on two counts: it requires that one build a sophisticated FEM mesh via a laborious workflow, and the large resulting stiffness matrix requires a non-trivial matrix solver algorithm, both of which impede the workflow.

There is a need for earth modeling methods that can accurately estimate stresses, strains, and stiffness in the presence of extreme heterogeneity. Such earth models can be used to guide decisions in acquisition, processing, imaging, inversion, and hydrocarbon reservoir property inference, as well as estimating locations of potential geomechanical drilling hazards, and ultimately impacting decisions on geomechanically lower risk and geologically optimum well placement, so improving hydrocarbon recovery.

SUMMARY OF THE INVENTION

Described herein are implementations of various approaches for a computer-implemented method for earth modeling of a geological volume of interest.

A computer-implemented method for earth modeling of a geological volume of interest includes receiving a rock model; specifying boundary conditions; initiating a stress field in at least part of the rock model; modeling resultant displacements using a finite difference method; calculating at least one of resultant strains, stresses, elastic energies and elastic stiffnesses based on the resultant displacements; and using the at least one of resultant strains, stresses, elastic energies and elastic stiffnesses to predict physical changes in the rock model is disclosed.

In another embodiment, a computer system including a data source or storage device, at least one computer processor, and a user interface used to implement the method for earth modeling of a geological volume of interest is disclosed.

In yet another embodiment, an article of manufacture including a non-transitory computer readable medium having computer readable code on it, the computer readable code being configured to implement a method for earth modeling of a geological volume of interest is disclosed.

The above summary section is provided to introduce a selection of concepts in a simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

These and other features of the present invention will become better understood with regard to the following description, claims and accompanying drawings where:

FIGS. 4A-4C illustrate static and time-lapse vertical strain due to oil depletion in a hydrocarbon reservoir.

DETAILED DESCRIPTION OF THE INVENTION

Figure 1:
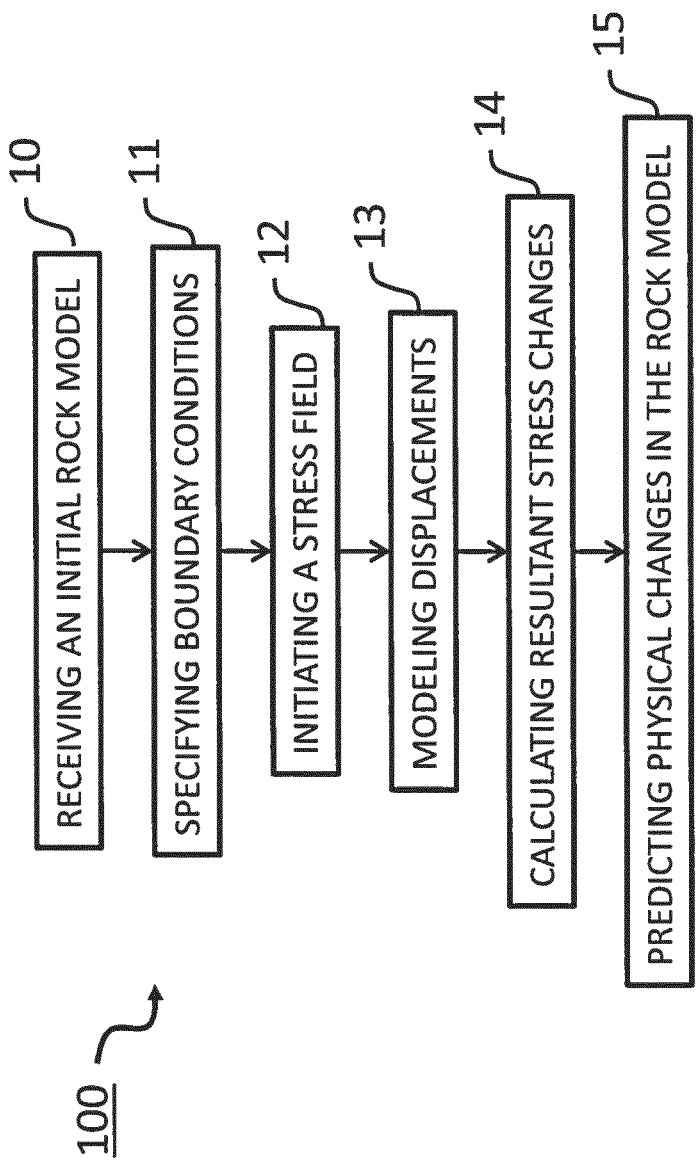
FIG. 1 is a flowchart of an embodiment of the present invention.

The present invention may be described and implemented in the general context of a system and computer methods to be executed by a computer. Such computer-executable instructions may include programs, routines, objects, components, data structures, and computer software technologies that can be used to perform particular tasks and process abstract data types. Software implementations of the present invention may be coded in different languages for application in a variety of computing platforms, environments, and architectures. It will be appreciated that the scope and underlying principles of the present invention are not limited to any particular computer software technology.

Moreover, those skilled in the art will appreciate that the present invention may be practiced using any one or combination of hardware and software configurations, including but not limited to a system having single and/or multiple processor computers, hand-held devices, tablet devices, programmable consumer electronics, mini-computers, mainframe computers, and the like. The invention may also be practiced in distributed computing environments where tasks are performed by servers or other processing devices that are linked through one or more data communications network. In a distributed computing environment, program modules may be located in both local and remote computer storage media including memory storage devices.

Also, an article of manufacture for use with a computer processor, such as a CD, pre-recorded disk or other equivalent devices, may include a tangible computer program storage medium and program means recorded thereon for directing the computer processor to facilitate the implementation and practice of the present invention. Such devices and articles of manufacture also fall within the spirit and scope of the present invention.

Referring now to the drawings, embodiments of the present invention will be described. The invention can be implemented in numerous ways, including, for example, as a system (including a computer processing system), a method (including a computer implemented method), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore are not to be considered limiting of its scope and breadth.

Figure 2A:
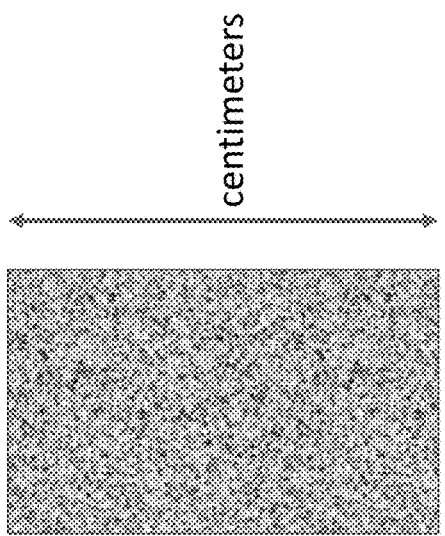
FIGS. 2A and 2B demonstrate the different scales that the present invention can act upon.
Figure 2B:

The present invention relates to earth modeling, specifically geomechanical and rock physics elastostatic modeling. The primary difference between geomechanical and rock physics elastostatic modeling is the scale. Rock physics modeling is typically small-scale, on the order of centimeters. Geomechanical modeling may be done for a subsurface reservoir or even a geological basin, on the order of tens of kilometers. This is illustrated in FIGS. 2A and 2B. FIG. 2A is an example of a core plug, which is typically between 2 to 5 centimeters long and perhaps 2 centimeters wide. FIG. 2B shows a reservoir model that may be tens of kilometers wide and deep. The present invention can be used at any scale.

As mentioned above, conventional solution methods for elastostatic boundary value problems in heterogeneous elastic models rely predominantly on the Finite Element Method (FEM) to solve this equation for the output of interest. FEM is an accurate solution method, but it suffers on two counts: it requires that one build a sophisticated FEM mesh via a laborious workflow, and the large resulting stiffness matrix requires a non-trivial matrix solver algorithm, both of which impede the workflow.

This workflow invention avoids the meshing and matrix-solve impediments of the FE Method entirely by re-purposing the time-domain Finite Difference Method (FDM) to work on elastostatic problems. Some previous works have proposed using FDM for rock physics and geomechanics, however these have not addressed the issue of the time-independent elastostatic problem. Finite-difference methods are explicitly time-dependent, which generally makes them unsuitable for a time-independent application. The present invention overcomes this limitation.

First, the FDM uses a standard rectangular grid. In one embodiment, for basin-wide geomechanical modeling it may use the same grid already built for allied purposes such as wavefield propagation through kilometer-scale earth models. This avoids the need for complicated meshing and the services of an expert. Second, time-domain FDM as typically used evolves elastic solutions explicitly in time via operator convolutions, avoiding matrix solves and running naturally on standard high-performance computing architecture.

The crux of the method is that explicit time-dependent FDM must solve an intrinsically time-independent elastostatic problem. It does this by slowly leaking kinetic energy out of the system via a numerical attenuation mechanism, whereby the system's potential energy decreases in lockstep. This tight coupling between the system's kinetic and potential energies is guaranteed by the Virial Theorem, which for elastic problems states that the average relative kinetic and potential energies remain equal. As the kinetic energy is forced to decrease according to a simple schedule, the potential energy approaches arbitrarily close to its own minimum, which by definition is the elastostatic solution to the boundary value problem of interest. From the resulting solutions for displacements can be derived all associated strains, stresses, elastic energies and elastic stiffnesses.

The standard continuum form of the elasticity equation of motion combining conservation of momentum with Hooke's law, and valid for isotropic or anisotropic media, is:

$$\rho \frac{\partial^2 u_i}{\partial t^2} = \frac{\partial \sigma_{ij}}{\partial x_j} + b_i$$

(cons. momentum) with stress tensor $$\sigma_{ij} = C_{ijkl} \frac{\partial u_k}{\partial x_l}$$

(Hooke's law), and displacement u, density ρ, time t, spatial dimension x, body force b and stiffness tensor C. In discrete form appropriate for implementation in a digital computer, there results: $u_i^{t+1} = L u_i^t - u_i^{t-1}$, where the superscripts t refer to the discrete computational time step and L is a linear operator that embodies the stiffnesses, spatial derivatives and source terms, all operating on the current-time value of the displacement u. In this manner the wavefield evolves forward in time, depending on the current and previous time step.

The attenuating mechanism is invoked by using a simple and well understood damping trick, namely rewriting the discrete equation above to be a weighted sum of the nominal update and the current time step, namely: $u_i^{t+1} = (1-\alpha)(L u_i^t - u_i^{t-1}) + \alpha u_i^t$, where the damping parameter α is kept equal to 0 for as many time steps τ as it takes the wavefield to cover the entire model, and then is allowed to increase asymptotically to its final value. In a typical embodiment, this damping parameter schedule is given by: $\alpha = 0.01(1 - e^{-0.005(t-\tau)})$ for t>τ, and 0 otherwise.

The intuitive need for slow attenuation to arrive at the elastostatic solution is provided by the Virial Theorem, which for bounded physical systems governed by Hooke's Law (i.e. geological materials), is given simply by: $\langle T \rangle = \langle V \rangle$ meaning the average kinetic T and potential V energies, consistent with the boundary conditions and body forces, must be equal, so that if the kinetic energy is slowly decreased, the potential energy will evolve toward its own minimum, i.e. the elastostatic solution.

Figure 3:
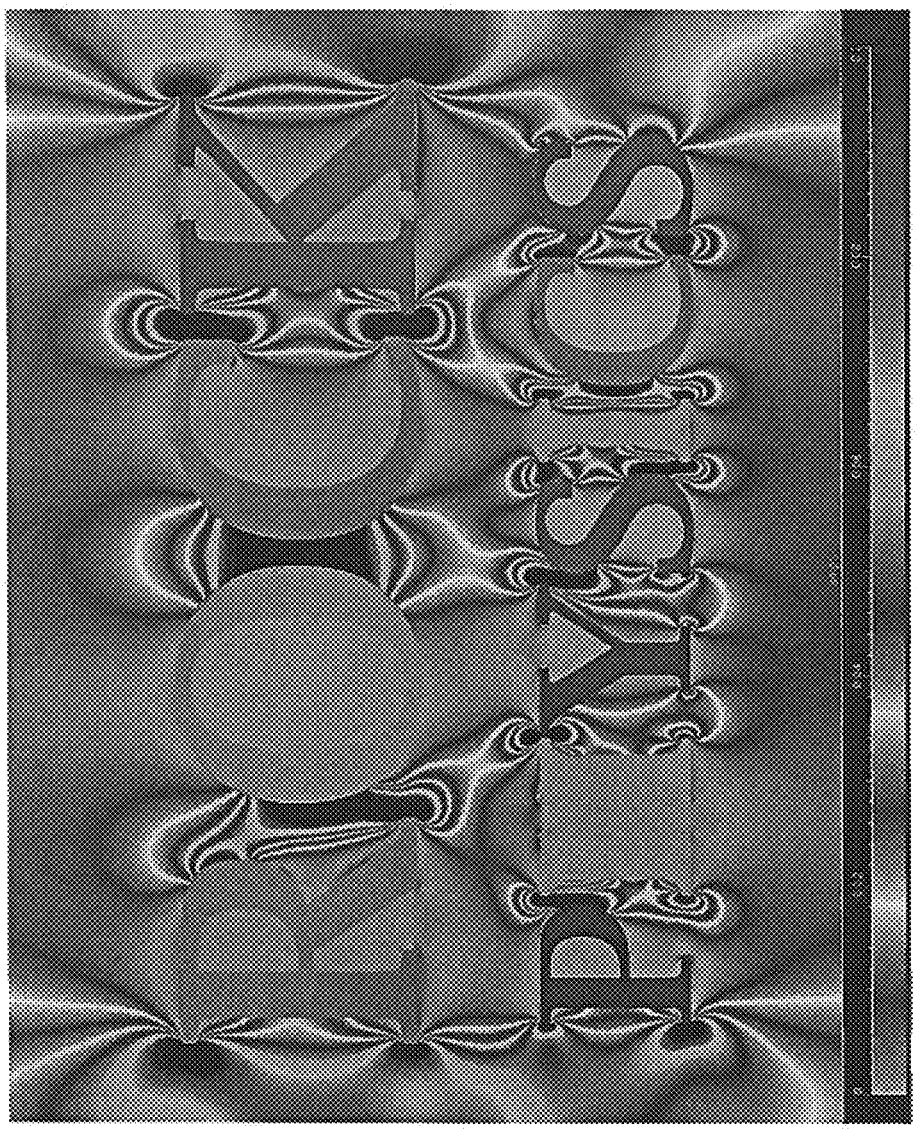
FIG. 3 is an illustration of strain energy due to an imposed vertical load.

The workflow can be used wherever the Finite Element Method (FEM) is used, and requires the same parameter input. It works on scales from small to large (FIG. 2). Specifically, the FDM described herein can be used on the small scale (centimeters) to numerically estimate the elastic stiffnesses of a rock-sample's image, also known as "digital rock physics" (FIG. 3). Alternatively the FDM can be used on a large scale (tens of kilometers) to model the stresses and strains developed in a volume of earth as a consequence of a petroleum reservoir's depletion (production) or inflation (injection) (FIGS. 4A-4C). FIG. 4A is a baseline reservoir model, FIG. 4B shows the time-lapse changes in the reservoir including areas of expansion indicated in areas 42, and FIG. 4C shows the reservoir model after depletion with the depleted area annotated. This modeling has value for predicting surface subsidence, well-drilling hazards, and changes in sound velocity. Further, this method can be used to estimate the trajectory that a hydrofracture could take as a function of internal fluid pressure and the surrounding earth heterogeneity.

The workflow itself is illustrated in FIG. 1 as method 100. An initial rock model, for example a reservoir model or a core plug model, is received 10. Boundary conditions are set 11. Boundary conditions may allow displacements at one or more sides of the model, not allow displacements at one or more sides, or allow a "wrap-around" displacement from opposing sides. A stress field is then initiated 12, which may include directional displacements at one or more of the sides of the model or stresses or strains internally. The resultant displacements are then modeled 13 as explained above using FDM applying the Virial Theorem. These displacements are used to calculate associated strains, stresses, elastic energies and elastic stiffnesses 14. The resultant displacements and the resultant stress changes can be used to predict physical changes in the rock model 15.

Figure 5:
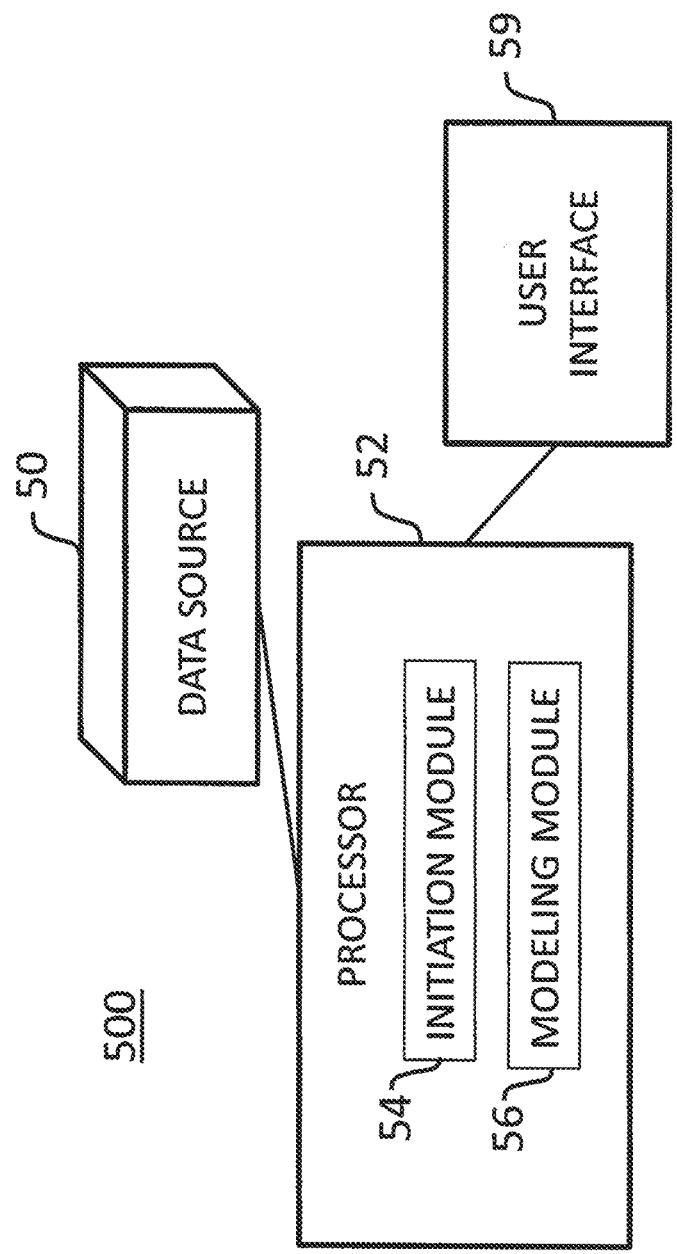
FIG. 5 schematically illustrates a system for performing a method in accordance with an embodiment of the invention.

A system 500 for performing the method 100 of FIG. 1 is schematically illustrated in FIG. 5. The system includes a data source/storage device 50 which may include, among others, a data storage device or computer memory. The data source/storage device 50 may contain a rock model. The data from data source/storage device 50 may be made available to a processor 52, such as a programmable general purpose computer. The processor 52 is configured to execute computer modules that implement method 100. These computer modules may include an initiation module 54 for setting boundary conditions and initiating the stress field and a modeling module 56 for performing FDM applied with the Virial Theorem. These modules may include other functionality. In addition, other modules such as an interpretation module for predicting physical changes in the rock model may be included. The system may include interface components such as user interface 59. The user interface 59 may be used both to display data and processed data products and to allow the user to select among options for implementing aspects of the method. By way of example and not limitation, the input seismic data and the elastostatic solutions computed on the processor 52 may be displayed on the user interface 59, stored on the data storage device or memory 50, or both displayed and stored.

While in the foregoing specification this invention has been described in relation to certain preferred embodiments thereof, and many details have been set forth for purpose of illustration, it will be apparent to those skilled in the art that the invention is susceptible to alteration and that certain other details described herein can vary considerably without departing from the basic principles of the invention. In addition, it should be appreciated that structural features or method steps shown or described in any one embodiment herein can be used in other embodiments as well.

What is claimed is:

1. A computer-implemented method for earth modeling of a geologic volume of interest, the method being implemented in a computer system that includes one or more physical computer processors and a user interface, the method comprising:
   a. receiving, at the one or more physical computer processors, a rock model that describes properties of the geologic volume of interest as a function of position within a rectangular grid through the geologic volume of interest;
   b. obtaining, at the one or more physical computer processors, boundary conditions;
   c. initiating, using the one or more physical computer processors, a stress field in at least part of the rock model;
   d. modeling, via the one or more physical computer processors, resultant displacements using a finite difference method which allows for leaking kinetic energy out of the rock model as a function of time while decreasing potential energy in lockstep using a Virial theorem;
   e. calculating, via the one or more physical computer processors, at least one of resultant strains, stresses, elastic energies, and/or elastic stiffnesses based on the resultant displacements;
   f. predicting, via the one or more physical computer processors, physical changes in the rock model using the at least one of resultant strains, stresses, elastic energies, and/or elastic stiffnesses; and
   g. outputting visual information depicting predictions of physical changes in the rock model via the user interface.

2. The method of claim 1 wherein the physical changes include one or more of surface subsidence, well-drilling hazards, and/or subsurface fracturing.

3. A system for earth modeling of a geologic volume of interest, the system comprising:
   a. a data source that includes a rock model that describes properties of the geologic volume of interest as a function of position within a rectangular grid through the geologic volume of interest;
   b. one or more physical computer processors configured to execute computer modules, the computer modules comprising:
      i. an initiation module configured to set boundary conditions and to initiate a stress field in at least a portion of the rock model; and
      ii. a modeling module configured to (i) model resultant displacements using a finite-difference method which allows for leaking kinetic energy out of the rock model as a function of time while decreasing potential energy in lockstep using a Virial Theorem, (ii) calculate at least one of resultant strains, stresses, elastic energies, and/or elastic stiffnesses based on the resultant displacements, and (iii) predict physical changes in the rock model using the at least one of resultant strains, stresses, elastic energies, and/or elastic stiffnesses; and
   c. a user interface, wherein the one or more physical computer processors are further configured to effectuate presentation of visual information depicting predictions of physical changes in the rock model.

\* \* \* \* \*